US008326605B2

(12) United States Patent
Balegar et al.

(10) Patent No.: US 8,326,605 B2
(45) Date of Patent: *Dec. 4, 2012

(54) DICTIONARY FOR TEXTUAL DATA COMPRESSION AND DECOMPRESSION

(75) Inventors: Umesh Kumar B. Balegar, Vijayanagar Bangalore (IN); Rohit Shetty, Karnataka (IN)

(73) Assignee: International Business Machines Incorporation, Armonk, NY (US)

( * ) Notice: Subject to any disclaimer, the term of this patent is extended or adjusted under 35 U.S.C. 154(b) by 1017 days.

This patent is subject to a terminal disclaimer.

(21) Appl. No.: 12/108,973

(22) Filed: Apr. 24, 2008

(65) Prior Publication Data

US 2009/0271181 A1 Oct. 29, 2009

(51) Int. Cl.
*G06F 17/21* (2006.01)
(52) U.S. Cl. .......................................... 704/10; 341/51
(58) Field of Classification Search ................. 704/10; 341/51
See application file for complete search history.

(56) References Cited

U.S. PATENT DOCUMENTS

| | | | | |
|---|---|---|---|---|
| 4,843,389 A * | 6/1989 | Lisle et al. | ..................... | 341/106 |
| 5,293,164 A * | 3/1994 | Bugajski et al. | ................ | 341/51 |
| 5,339,076 A * | 8/1994 | Jiang | ................ | 341/51 |
| 5,369,605 A * | 11/1994 | Parks | ........................... | 708/210 |
| 5,872,530 A * | 2/1999 | Domyo et al. | ................ | 341/106 |
| 5,884,014 A | 3/1999 | Huttenlocher et al. | | |
| 5,991,713 A * | 11/1999 | Unger et al. | ...................... | 704/9 |
| 5,999,949 A * | 12/1999 | Crandall | ....................... | 715/234 |
| 6,047,298 A * | 4/2000 | Morishita | ...................... | 715/236 |
| 7,026,962 B1 * | 4/2006 | Emami et al. | .................... | 341/51 |
| 7,283,072 B1 * | 10/2007 | Plachta et al. | ................ | 341/107 |
| 2004/0225497 A1 * | 11/2004 | Callahan | ....................... | 704/235 |

OTHER PUBLICATIONS

P. Thomas et al., "The Influence of IEEE on Key Patents," 1970 Analytics Technical Report prepared for IEEE, Jan. 12, 2006.
W. Sun et. al., "A dictionary-based multi-corpora text compression system", Data Compression Conference, 2003. Proceedings. DCC 2003.
A. Kuri et. al., "Pattern-based data compression," in MICAI 2004: Advances in Artificial Intelligence, 2004, ISBN 978-3-540-21459-5.
P.M. Tolani et. al., "XGRIND: A query-friendly XML compressor," in Procs. 18th Int'l Conf. on data Engineering (ICDE'02), pp. 225-234, San Jose, USA. 2002.

(Continued)

*Primary Examiner* — Talivaldis Ivars Smits
*Assistant Examiner* — Shaun Roberts
(74) *Attorney, Agent, or Firm* — Jeff LaBaw

(57) ABSTRACT

A dictionary for compressing and decompressing textual data has a number of keys. Each key is associated with an identifier. The keys include static word or phrase keys, where each static word or phrase key lists one or more unchanging words in a particular order. The keys further include dynamic phrase keys, where each dynamic phrase key lists a number of words and one or more placeholders in a particular order, and each placeholder denotes a place where a word or phrase other than the words of the dynamic phrase key is to be inserted. At least one of the dynamic phrase keys may identify one or more of the words by identifiers for corresponding static words or phrase keys. At least one of the static word or phrase keys may identify one or more of the words by identifiers for corresponding other static words or phrase keys.

19 Claims, 4 Drawing Sheets

OTHER PUBLICATIONS

J.M. Gilbert, "Text/graphics and image transmission over bandlimited lossy links," Thesis, Graduate Div. of Univ. of Cal., Berkeley, Spring 2000.

P. Thomas et. al. "The Influence of IEEE on Key Patents, "technical paper dated Jan. 12, 2006, available from 1790 Analytics, LLC.

R. Kems, "What are dictionary-based compression algorithms and how do they function?," Jan. 14, 2002, http://expertanswercenter.techtarget.com.

P. Skibinski et. al., "Revisiting dictionary-based compression," Research Articles, Software-Practice & Experience, v.35 n. 15, p. 1455-1476, Dec. 2005.

A.R. Alameldeen et. al., "Frequent pattern compression: A significance-based compression scheme for L2 caches, "Technical Report 1500, Comp. Sc. Dept. UW-Madison, Apr. 2004.

M-H Ho et. al., "A dictionary-based compressed pattern matching algorithm," Procs. of 26th Annual Int'l Comp. S/w & Applns. Conf., 2002.

G. Keramidas et., al., "Dynamic dictionary-based data compression for level-1 caches," in Architecture of Computing Systems—ARCS 2006, 2006, ISBN 978-3-540-32765-3.

R. Ahuja, "Introducing DB2 9, Part 1: Data compression in DB2 9," May 24, 2006, http://www-128.ibm.com.

R. Franceschini, "Data compression using encrypted text," IEEE Procs. of Adv'ed Digital Libraries, 1996.

R. Ahuja, "Introducing DB2, Part 1," www.ibm.com, dated May 24, 2006.

N. J. Larsson et al., "Off-line dictionary-based compression," Procs. Of IEEE, vol. 88, No. 11, Nov. 2000.

\* cited by examiner

DICTIONARY FOR TEXTUAL DATA COMPRESSION AND DECOMPRESSION

The present application is related to co-pending and commonly assigned U.S. patent application Ser. No. 12/108,914, entitled "DICTIONARY FOR TEXTUAL DATA COMPRESSION AND DECOMPRESSION," filed on Apr. 24, 2008, which is hereby incorporated by reference.

FIELD OF THE INVENTION

The present invention relates generally to compression and decompression of textual data, and more particularly to dictionary-based compression and decompression techniques.

BACKGROUND OF THE INVENTION

Dictionary-based compression techniques for compressing textual data typically employ keyword dictionaries. The keyword dictionaries identify static words or static phrases by identifiers, such as small codes. Compressing textual data using such a dictionary includes replacing the static words and static phrases of the dictionary that are present within the textual data with their corresponding identifiers. The dictionary is stored with the compressed textual data so that the dictionary can be used in decompressing the textual data when needed.

Such prior art dictionary-based compression techniques achieve compression, but typically with a large degree of redundancy within the dictionary itself. For example, there may be occurrences of the word "compression" and the phrase "complete compression." A dictionary may store one key for the word "compression" and another key for the phrase "complete compression," or it may store one key for the word "compression" and another key for the word "complete." In the former instance, the dictionary redundantly stores the word "compression" twice: a first time as its own key, and a second time as part of the phrase "complete compression." In the latter instance, replacing the phrase "complete compression" within textual data to be compressed involves using two identifiers, one of the word "complete" and another for the word "compression," instead using a single identifier as in the former instance.

Furthermore, existing dictionary-based compression techniques are unable to efficiently compress dynamic patterns within textual data. For instance, a first phrase within the textual data may be "My friend Harish does a good job," and a second phrase within the textual data may be "My friend Sateesh does a great job." The pattern for these two phrases is "My friend [1] does a [2] job," where the words identified by "[1]" and "[2]" differ between the two phrases. Existing dictionary-based compression techniques just replaces keys for the words and phrases "My friend," "does a," "good," "great," and "job" within each of these phrases, for a total of five identifiers plus the word "Harish" or "Sateesh" (which remains uncompressed), which is a simplistic and non-maximal compression of the phrases.

These and other shortcomings of the prior art are addressed by the present invention.

SUMMARY OF THE INVENTION

The present invention relates to an improved dictionary for textual data compression and decompression having dynamic phrase keys. A dictionary for compressing and decompressing textual data has a number of keys. Each key is associated with an identifier. The keys include static word or phrase keys, where each static word or phrase key lists one or more unchanging words in a particular order. The keys further include dynamic phrase keys, where each dynamic phrase key lists a number of words and one or more placeholders in a particular order, and each placeholder denotes a place where a word or phrase other than the words of the dynamic phrase key is to be inserted. At least one of the dynamic phrase keys may identify one or more of its words by identifiers for corresponding static words or phrase keys. At least one of the static word or phrase keys may identify one or more of the words of the static word or phrase key by identifiers for corresponding (other) static words or phrase keys.

For example, there may be static word or phrase keys within the dictionary for the words and phrases "My friend," "does a," "good," "great," and "job." There may further be a dynamic phrase key that lists the keys for the static word or phrase keys "My friend," "does a," and "job" by identifier in this order. The dynamic phrase key may include a first placeholder between the identifiers for "My friend" and "does a," and a second placeholder between the identifiers for "does a" and "job."

Therefore, the phrase "My friend Harish does a good job" can be compressed by replacing this phrase with the identifier for the dynamic phrase key, the word "Harish" (which may remain uncompressed), and the identifier for the word "good," where the word "Harish" is to be inserted at the first placeholder, and the word "good" is to be inserted at the second placeholder. Similarly, the phrase "my friend Sateesh does a great job" can be compressed by replacing this phrase with the identifier for the dynamic phrase key, the word "Sateesh" (which may remain uncompressed) and the identifier for the word "great." Thus, where in the prior art each of these phrases is compressed using a total of five identifiers, in an embodiment of the claimed invention each of these phrases is compressed using a total of just two identifiers.

Still other advantages, aspects, and embodiments of the invention will become apparent by reading the detailed description that follows, and by referring to the accompanying drawings.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE DRAWINGS

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Constructing Dictionary for Compressing and Decompressing Textual Data

Figure 1:
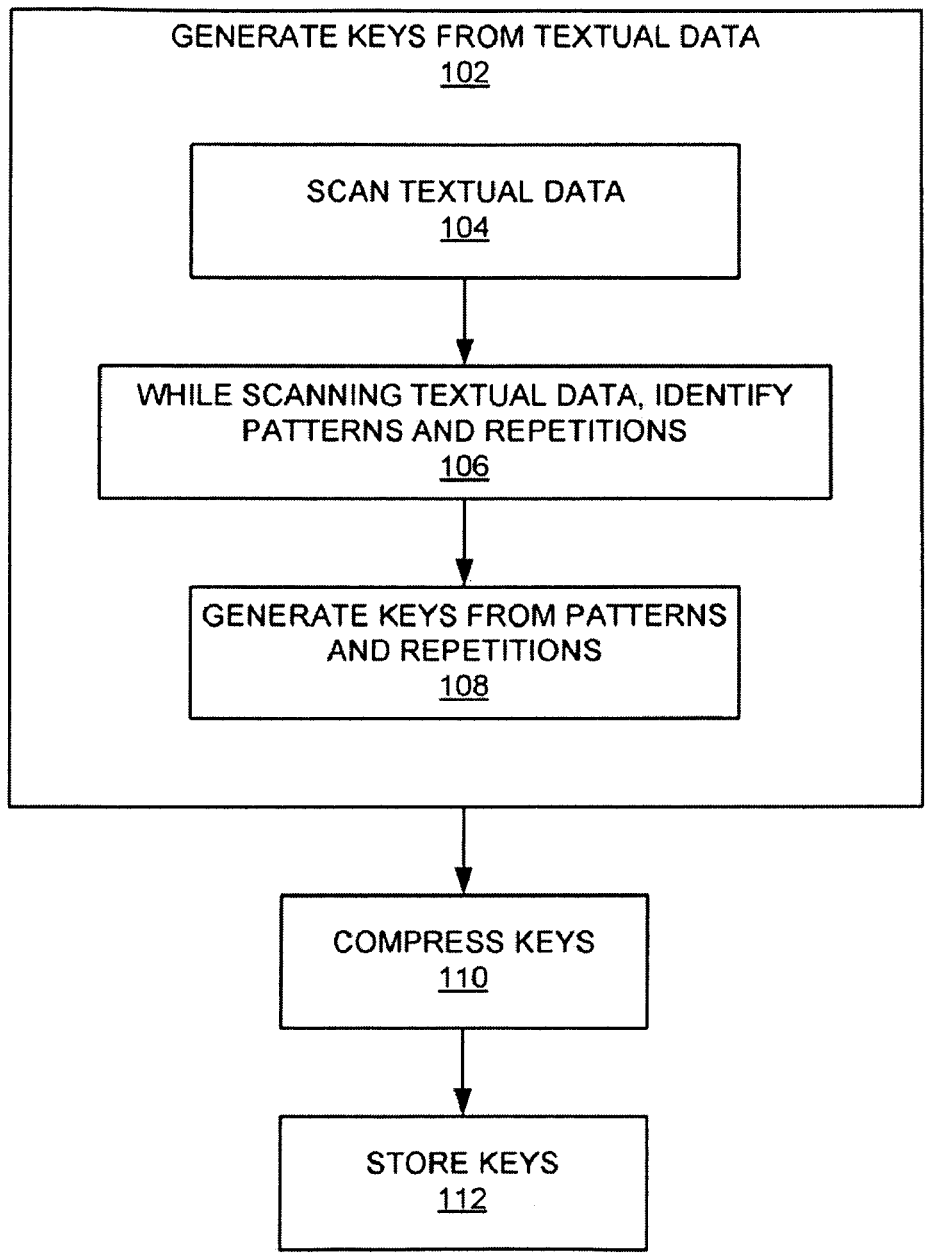
FIG. 1 is a flowchart of a method for constructing a dictionary for compressing and decompressing textual data, according to an embodiment of the invention.

FIG. 1 shows a method 100 for constructing a dictionary for compressing and decompressing textual data, according to an embodiment of the invention. As with the other methods of embodiments of the invention, the method 100 may be implemented as one or more computer programs stored on a computer-readable medium, such as a recordable data storage medium, and executed by one or more processors. The method 100 is performed in relation to textual data. The textual data in question may be the same textual data, or different textual data, that is to be compressed using the dictionary that is constructed by performing the method 100.

The method 100 generates a number of keys of the dictionary from textual data. Each key is associated with a unique identifier, such as a code like one or more bytes. In one embodiment, there are a number of different types of keys. A static word or phrase key lists one or more unchanging words in a particular order. The words are static in that they are unchanging and are the only word or words that are always associated with the key in question. For instance, a static word or phrase key may list a single particular word, such as "Today" or "course." A static word or phrase key may alternatively list a number of particular words in a specific order, such as "is a."

A static word or phase key may further identify one or more of its words by the identifiers of corresponding other word or phrase keys. For instance, a static word or phrase key may correspond to the phrase "is a course." Rather than spelling out this phrase within the key itself, the word or phrase key may instead identify the key for the static word or phrase key "is a" followed by the word or phrase key for the static word or phrase key "course."

A dynamic phrase key lists a number of words and one or more placeholders in a particular order. The words listed are unchanging and static. However, each placeholder denotes a place where a word or phrase other than the (unchanging) words of the dynamic phrase key is to be inserted. The (unchanging) words of the dynamic phrase key may further be identified by the identifiers of corresponding word or phrase keys, instead of listing out the words them selves, as in the previous paragraph.

For example, a dynamic phrase key may be "is a good day to [*] the course." The words "is a" may be represented within the dynamic phrase key by the identifier for the static word or phrase key "is a," instead of explicitly spelling out these words within the key. Likewise, the word "course" may be represented within the dynamic phrase key by the identifier for the static word or phrase key "course," instead of explicitly spelling out these words within the key. The words "good day to" may be explicitly spelled out within the dynamic phrase key. The symbols "[*]" denote a placeholder, to be replaced by a particular word or phrase is to be inserted when compressing a given phrase of textual data having a pattern corresponding to the pattern of the dynamic phrase key.

Thus, the example keys that have been described in the preceding paragraphs form the following dictionary.

```
01 Today
02 Course
03 is a
04 (03) good day to [*] the (02)
05 (03) (02)
```

In this dictionary, each row denotes a key. The left-hand column denotes an identifier of the key, and the right-hand column denotes the words of the key, the identifiers referencing the words of other keys, and/or the placeholders to be replaced by particular words or phrases during compression. For example, the last key in the dictionary references the identifier for the third key followed by the identifier for the second key, corresponding to the phrase "is a course." As such, rather than representing the phrase "is a course" with the twelve characters that make up this phrase, the last key instead represents this phrase by, for example, two characters: a character corresponding to the third key followed by a character corresponding to the second key.

In one embodiment, part 102 of the method 100 is performed as follows. The textual data being used to construct the dictionary is scanned (104). As the textual data is scanned, patterns and repetitions are identified (106). For example, the following textual data may be used to generate the example dictionary that has been described above:

Today is a good day to complete the course. Today or tomorrow is a good day to think about the course. Life is a course.

In this textual data, the words and phrases "Today," "course," and "is a" are repeated and thus are repetitions identified in part 106. Furthermore, the pattern "* is a good day to * the course" is repeated as well and is a repetition identified in part 106, where "*" represents a part of the pattern that does not remain the same among the repetitions within the textual data.

Thereafter, the keys are generated from the patterns and the repetitions that have been identified (108). In particular, the patterns and the repetitions are broken down into words and phrases (i.e., the latter being groups of words) that are repeating. For each repetition, a corresponding key with a unique identifier is added to the dictionary. Static word or phrase keys representing a single word spell out the single word in question. In the example dictionary described above, for instance, the first and the second keys spell out the single words "Today" and "course," respectively.

Keys corresponding to phrases (either static word or phrase keys representing more than one word, or dynamic phrase keys) spell out just the words of the phrases that do not have their own keys, and identify the words that have their own keys by the identifiers for these keys. In the example dictionary described above, for instance, the third key spells out the words "is a" because these words do not have their own keys. By comparison, the fifth key, representing the phrase "course is a" identifies the identifiers for the keys for the word "course" and the phrase "is a," since they have their own keys. Keys corresponding to dynamic phrase keys further indicate placeholders representing parts of the pattern of the phrases that do not remain the same among the repetitions within the textual data, as in the fourth key of the example dictionary described above.

Once the keys have been generated in part 102, the keys, including their identifiers, may be compressed using a non-dictionary-based compression technique to further make the size of the resulting dictionary smaller (110). For example, compression techniques known to those of ordinary skill within the art as LZ, zip, and others may be employed in part 110. Finally, the keys and their identifiers (i.e., the dictionary itself as may have been compressed in part 110 are stored (112), such as on a storage device like a hard disk drive or another type of storage device, for subsequent use to compress textual data.

Figure 2:
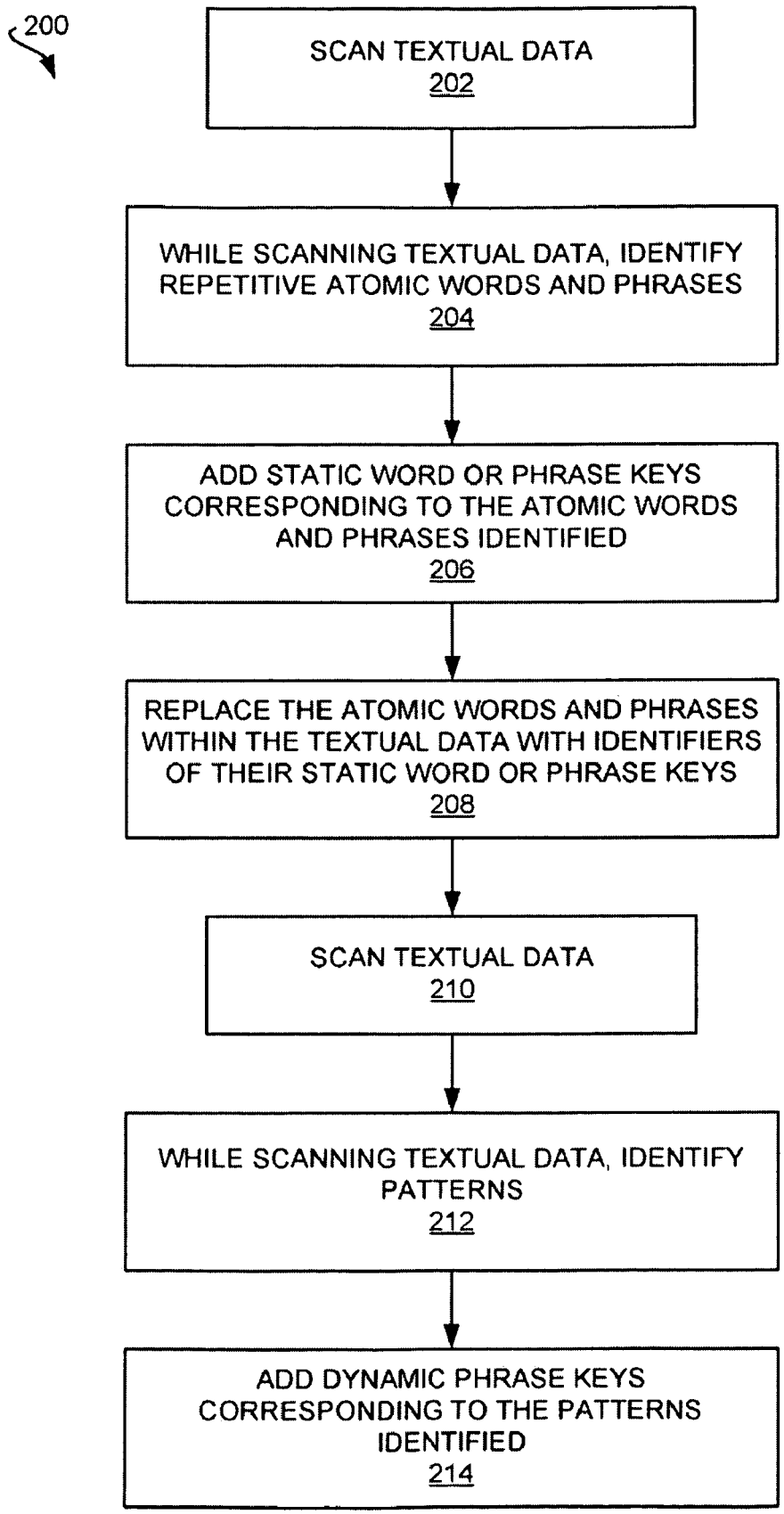
FIG. 2 is a flowchart of a method for constructing a dictionary that is more detailed than but consistent with the method of FIG. 1, according to an embodiment of the invention.

FIG. 2 shows a method 200 that can also be used to implement part 102 of the method 100, according to an embodiment of the invention. The method 200 is more detailed than but consistent with the method 100 of FIG. 1. The textual data used to construct the dictionary is scanned at a first time (202), during which repetitive atomic words and phrases are identified (204).

A word or phrase is atomic in that it is indivisible into shorter words and phrases that are repetitive within the textual data. For example, if the words "is" and "a" only appear together within the phrase "is a" within the textual data, then the repetitive phrase "is a" is atomic, because neither the word "is" nor the word "a" repeat except as a phrase. By comparison, the words "is a course" may not be atomic if the word "course" appears within the textual data at places other than as part of this phrase. As such, the words "is a course" are divided over two atomic words and phrases: "is a" and "course."

Once the repetitive atomic words and phrases have been identified, static word or phrase keys corresponding to these atomic words and phrases are added to the dictionary under construction (206). For each key, a unique identifier is assigned. The unique identifier may be one or more bytes, for instance. Thereafter, all instances of the atomic words and phrases within the textual data are replaced with the unique identifiers of the atomic words and phrases (208).

The textual data used to construct the dictionary is scanned at second time (210), during which patterns are identified (212). A pattern includes one or more words and one or more identifiers identifying static word or phrase keys in a particular order, which appear in more than one place within the textual data. Furthermore, for a given pattern having a number of occurrences within the textual data, there are one or more words differentiating the occurrences from one another, where the occurrences are otherwise identical to one another.

For example, the textual data may include "(03) good day to complete the (02)" and "(03) good day to think about the (02)," where "(03)" is the identifier for the static word or phrase key "is a" and "(02)" is the identifier for the static word or phrase key "course." These two occurrences are identical (and thus are occurrences of the same pattern), except for the following difference. The difference is that the first occurrence has the word "complete" where the second occurrence has the words "think about."

Dynamic phrase keys are added to the dictionary under construction for the patterns that have been identified (214). As before, for each key, a unique identifier is assigned. For each pattern, the differences among the occurrences for the pattern are replaced by placeholders.

For instance, in the example described above, the difference between the two occurrences of the pattern is that the first occurrence has the word "complete" where the second occurrence has the word "think about." Therefore, in the dynamic phrase key added to the dictionary, this point of distinction is replaced by a placeholder, such as the symbol "[*]" in one embodiment of the invention. The resulting dynamic phrase key added to the dictionary is thus "(03) good day to [*] the (02)."

Compressing Textual Data Using Dictionary

Figure 3:
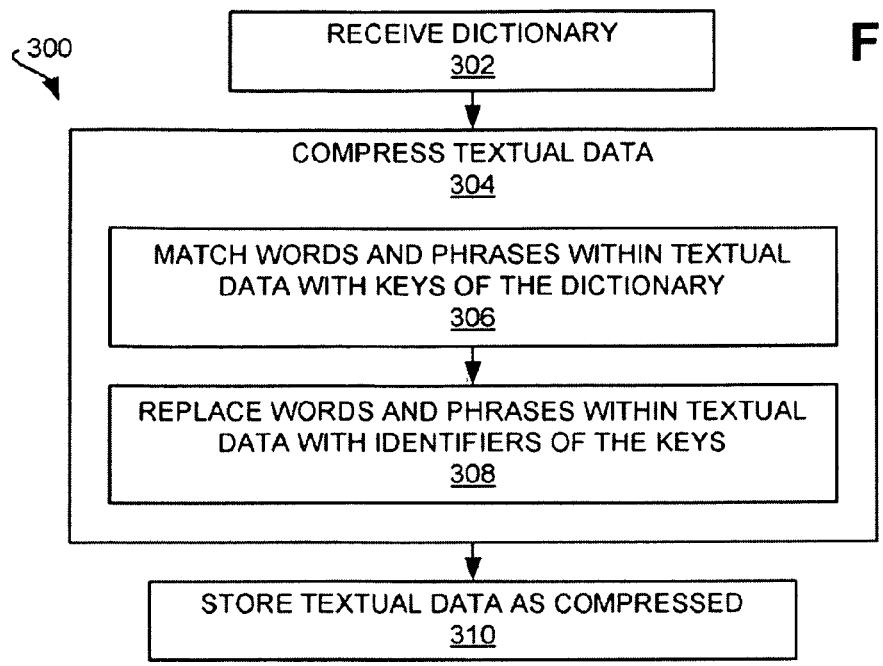
FIG. 3 is a flowchart of a method for compressing textual data using a dictionary, according to an embodiment of the invention.

FIG. 3 shows a method 300 for compressing textual data using a dictionary that has been constructed as described in the previous section of the detailed description, according to an embodiment of the invention. The textual data compressed by performing the method 300 may be the same textual data that has been used to construct the dictionary. Alternatively, the textual data that is compressed may be different textual data than that which has been used to construct the dictionary.

The method 300 receives the dictionary (302). The dictionary includes static word or phrase keys, as well as dynamic phrase keys. One or more of these keys may include identifiers to other keys. For instance, in the example dictionary described in the previous section of the detailed description, the last (fifth) key includes identifiers referencing the second and third keys, instead of spelling out the words of the second and third keys within the last key itself.

The textual data is compressed using the dictionary (304). In general, the words and phrases within the textual data are matched to the keys of the dictionary (306), and these matching words and phrases are replaced within the textual data with the identifiers of the corresponding keys (308). For each dynamic phrase key that is found in the textual data, the corresponding portion of the textual data is replaced by the identifier of the dynamic phrase key, as well as the text to be inserted at each placeholder of the dynamic phrase key. The text to be inserted at a placeholder may be itself be identified in a particular way, such as by the preceding notation "[N]," where N signifies the number of words following the notation that are to replace the placeholder when subsequently decompressing the textual data.

For example, the following textual data that was used to generate the example dictionary of the previous section of the detailed description may also be compressed using the example dictionary:

Today is a good day to complete the course. Today or tomorrow is a good day to think about the course. Life is a course.

Matching the words and phrases of this textual data with the keys of the dictionary yields the following compressed textual data:

(01) (04)[1] complete. (01) or tomorrow (04)[2]think about. Life (05). Thus, the words and phrases "Today" and "is a course" within the textual data are replaced by the identifiers for the static word or phrase keys (01) and (04), respectively, which correspond to these words and phrases.

Furthermore, the phrase "is a good day to complete the course" within the textual data is replaced by "(04)[1] complete." The notation "(04)" signifies that this phrase corresponds to the pattern or phrase of the dynamic phrase key (04). The notation "[1]" signifies that the placeholder within this dynamic phrase key is to be replaced by the single word following the notation—"complete"—which is particularly listed (i.e., spelled out) in the compressed textual data. The numeral one within the notation "[1]" thus signifies that the first word following the notation is to replace the placeholder of this occurrence of the dynamic phrase key.

Likewise, the phrase "is a good data to think about the course" within the textual data is replaced by "(04)[2]think about." The notation "(04)" again signifies that this phrase corresponds to the pattern or phrase of the dynamic phrase key (04). The notation "[2]" signifies that the placeholder within this dynamic phrase key is to be replaced by the two words following the notation—"think about"—which are particularly listed (i.e., spelled out) in the compressed textual data. The numeral two within the notation "[2]" thus signifies that the two words following the notation are to replace the placeholder of this occurrence of the dynamic phrase key.

Once the textual data has been compressed, it is stored (310). For instance, the textual data may be stored on a hard disk drive or other storage device. The textual data has been compressed in that the words and phrases within the textual data that match keys of the dictionary have been replaced with the identifiers of the keys as described in relation to part 304 of the method 300. The dictionary may also be stored as part of compressed textual data in part 310 of the method 300.

Figure 4:
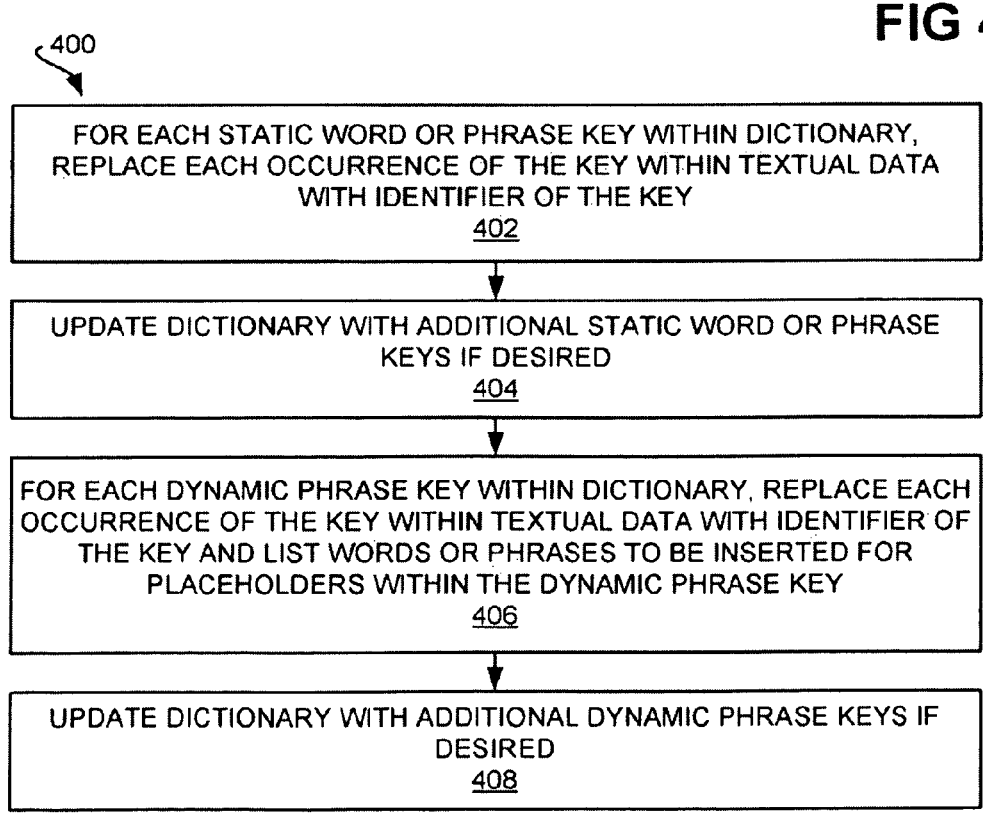
FIG. 4 is a flowchart of a method for compressing textual data that is more detailed than but consistent with the method of FIG. 3, according to an embodiment of the invention.

FIG. 4 shows a method 400 that can also be used to implement part 304 of the method 300, according to an embodiment of the invention. The method 400 is more detailed than but consistent with the method 300 of FIG. 3. First, for each static word or phrase key within the dictionary, where the static word or phrase keys may be processed in the order in which they appear within the dictionary, each occurrence of such a key within the textual data is replaced with the identifier of this key (402).

For example, consider the phrase "is a course" within the textual data. Where the static word or phrase keys of the example dictionary described in the previous section of the detailed description are processed in the order in which they appear within the dictionary, first the word "course" is replaced by the identifier for the second key, yielding the partially compressed textual data "is a (02)." Next, the phrase "is a" is replaced by the identifier for the third key, yielding the partially compressed textual data "(03) (02)." Thereafter, the phrase "(03) (02)" that references these two identifiers is replaced by the fifth key, yielding the compressed textual data "(05)."

Thus, due to the manner in which the dictionary may have been constructed, first the atomic words and phrases are replaced within the textual data by the identifiers for their corresponding keys, such as the second and third keys of the example dictionary. Thereafter, the non-atomic phrases are replaced within the textual data by the identifiers for their corresponding keys, such as the fifth key of the example dictionary. In this way, the textual data can be compressed in relation to the static word or phrase keys via just one pass of the textual data in correspondence with just one pass of the dictionary.

The textual data that is undergoing compression may not be the same textual data that was initially used to generate the dictionary. Therefore, the dictionary may be updated with additional static word or phrase keys if desired (404), for maximal compression of the textual data undergoing compression. Part 404 is achieved by performing parts 202, 204, and 206 of the method 200 of FIG. 2 that has been described in the previous section of the detailed description, and then performing part 402 again in relation to these newly added static word or phrase keys (which is the same as performing part 208 of the method 200, for instance).

Next, for each dynamic phrase key within the dictionary, where the dynamic phrase keys may be processed in the order in which they appear within the dictionary, each occurrence of such a key within the textual data is replaced with the identifier of this key, as well the words or phrases to be inserted for placeholders within the key (406). Thus, the compression of the textual data in the method 400 is a two-part process. First, in part 402, the static word or phrase keys of the dictionary are processed in relation to the textual data. Second, in part 406, the dynamic phrase keys of the dictionary are processed in relation to the textual data.

For example, consider the phrase "is a good day to complete the course." In part 402, this phrase is partially compressed to "(03) good day to complete the (02)." In part 406, this phrase matches the pattern of the dynamic phrase key of the example dictionary described in the previous section of the detailed description. Thus, the phrase is more completely compressed to "(04)[1] complete," where as has been noted, the notation "[1]" indicates that the following one word "complete" is to replace the placeholder within this dynamic phrase key. By compressing occurrences of the static word or phrase keys within the textual data first, in other words, compressing occurrences of the dynamic phrase keys within the textual data is more easily achieved. For example, the phrase "(03) good day to complete the (02)" is easily matched to the pattern of this dynamic phrase key.

As has been noted, the textual data that is undergoing compression may not be the same textual data that was initially used to generate the dictionary. Therefore, the dictionary may be updated with additional dynamic phrase keys if desired (408), for maximal compression of the textual data undergoing compression. Part 408 is achieved by performing parts 210, 212, and 214 of the method 200 of FIG. 2 that has been described in the previous section of the detailed description, and then performing part 406 again in relation to these newly added dynamic phrase keys.

Decompressing Textual Data Using Dictionary

Figure 5:
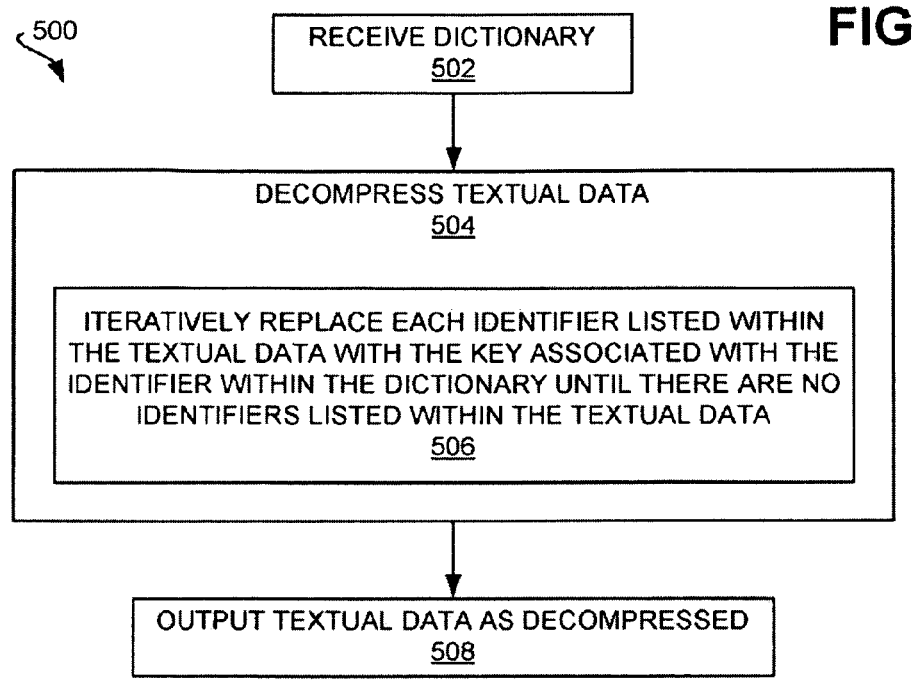
FIG. 5 is a flowchart of a method for decompressing textual data using a dictionary, according to an embodiment of the invention.

FIG. 5 shows a method 500 for decompressing textual data that has been compressed using a dictionary that has been constructed as described in a previous section of the detailed description, according to an embodiment of the invention. The method 500 receives the dictionary that was used to compress the textual data (502). The dictionary may have been added to the compressed textual data itself, or it may be received separately from the compressed textual data.

The textual data is then decompressed using the dictionary (504). In particular, this is achieved by iteratively replacing each identifier listed within the textual data with the key associated with the identifier within the dictionary, until there are no identifiers listed within the textual data (506). Such iterative decompression is now described in more detail, in relation to the following compressed textual data that has been compressed using the example dictionary described in a preceding section of the detailed description:

(01) (04)[1] complete. (01) or tomorrow (04)[2]think about. Life (05).

The first identifier located in the textual data, "(01)," is replaced with the text of the corresponding key within the dictionary that has this associated identifier, "Today." Because no identifiers appear in this text, decompression of this identifier is complete. Next, the second identifier located in the textual data, "(04)," is replaced with the text of the corresponding key within the dictionary that has this associated identifier, "(03) good day to [*] the (02)." This text still has identifiers, so the first identifier within this replaced text, "(03)," is replaced with the text of the corresponding key within the dictionary that has this associated identifier, "is a."

The next identifier within this replaced text is actually a placeholder, "[*]." Therefore, the text following the occurrence of the identifier "(04)" within the textual data being processed is examined to determine how this placeholder is to be replaced. This text is "[1]," which signifies that the single word following this notation, "complete," is to replace the placeholder (i.e., be inserted in lieu of the placeholder). Finally, the third identifier in the replaced text is "(03)," and thus is replaced by the text of the third key within the dictionary, "is a."

The fourth identifier in the textual data is "(04)," and thus is replaced with the text of the fourth key within the dictionary, "(03) good day to [*] the (02)." This text still has identifiers, so the first identifier within this replaced text, "(03)," is replaced with the text of the third key within the dictionary, "is a." The next identifier within this replaced text is a placeholder, "[*]." Therefore, the text following this occurrence of the identifier "(04)" within the textual data being processed is examined to determine how this placeholder is to be replaced.

This text is "[2]," which signifies that the two words following this notation, "think about," are to replace the placeholder (i.e., be inserted in lieu of the placeholder). Finally, the third identifier in the replaced text is "(03)," and thus is replaced by the text of the third key within the dictionary, "is a."

The last identifier in the textual data is "(05)," and is replaced with the text of the fifth key within the dictionary, "(03) (02)." Because within this replaced text there are two identifiers, "(03)" and "(02)," both of these identifiers are also replaced with the corresponding text of the third and second keys within the dictionary, respectively, "is a" and "course." Thus, decompression of the textual data is complete, yielding the uncompressed textual data:

> Today is a good day to complete the course. Today or tomorrow is a good day to think about the course. Life is a course.

The method 500 of FIG. 5 concludes by outputting the textual data as has been decompressed (508). Outputting may include displaying the text to the user, printing the text on a printing device, or another type of output. For instance, the decompressed textual data may be stored on a storage device like a hard disk drive.

Representative System and Conclusion

Figure 6:
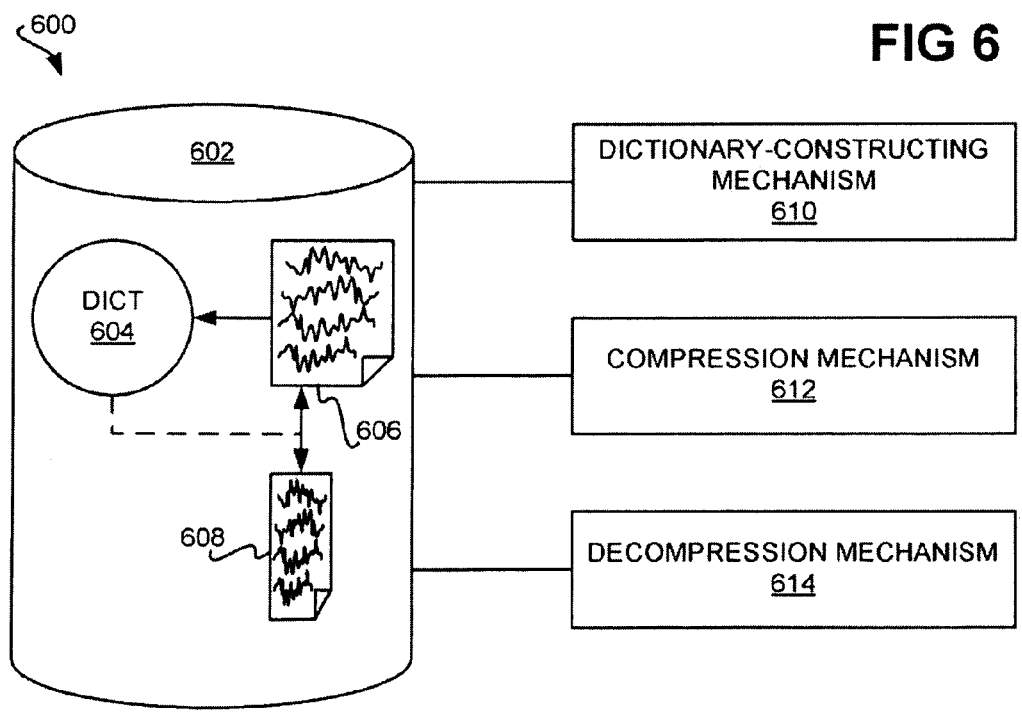
FIG. 6 is a diagram of a representative system, according to an embodiment of the invention.

FIG. 6 shows a representative system 600, according to an embodiment of the invention. The system 600 includes a storage device 602, which may be a hard disk drive or another type of storage device. The storage device 602 stores a dictionary 604 that is constructed as has been described in previous sections of the detailed description. The dictionary 604 is constructed by using uncompressed textual data 606. The textual data 606 may then be compressed to yield compressed textual data 608. In another embodiment, however, the textual data used to generate the dictionary 604 may be textual data in addition to and/or other than the textual data 606 that is compressed using the dictionary 604.

The system 600 also includes a dictionary-constructing mechanism 610, a compression mechanism 612, and a decompression mechanism 614. Each of the mechanisms 610, 612, and 614 may be implemented in software, hardware, or a combination of software and hardware. For instance, the mechanisms 610, 612, and 614 may each include one or more computer programs that are executed by one or more processors of a computing device.

The dictionary-constructing mechanism 610 constructs or generates the dictionary 604 from the textual data 606. The mechanism 610 may perform the method 100 of FIG. 1 and/or the method 200 of FIG. 2, for instance. The compression mechanism 612 compresses the textual data 606, using the dictionary 604, to yield the compressed textual data 608. The mechanism 612 may perform the method 300 of FIG. 3 and/or the method 400 of FIG. 4, for instance. The decompression mechanism 614 decompresses the compressed textual data 608 to yield the decompressed textual data 606. The mechanism 614 may perform the method 500 of FIG. 5, for instance.

It is finally noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. Therefore, it is manifestly intended that this invention be limited only by the claims and equivalents thereof.

We claim:

1. A system comprising:
a storage device storing first textual data, uncompressed second textual data, compressed third textual data, and a dictionary, the dictionary having a plurality of keys, each key associated with an identifier, the keys comprising:
a plurality of static word or phrase keys, each static word or phrase key listing one or more unchanging words in a particular order; and,
a plurality of dynamic phrase keys, each dynamic phrase key listing a plurality of words and one or more placeholders in a particular order, each placeholder denoting a place where a word or phrase other than the words of the dynamic phrase key is to be inserted;
a dictionary-constructing mechanism to generate the dictionary from the first textual data;
a compression mechanism to compress the uncompressed second textual data to yield the compressed third textual data using the dictionary; and,
a decompression mechanism to decompress the compressed third textual data to yield the uncompressed second textual data using the dictionary.

2. The system of claim 1, wherein the dictionary-constructing mechanism to generate the dictionary from the first textual data comprises
generating a plurality of keys of the dictionary, from second textual data, each key associated with an identifier, the keys comprising:
a plurality of static word or phrase keys, each static word or phrase key listing one or more unchanging words in a particular order; and,
a plurality of dynamic phrase keys, each dynamic phrase key listing a plurality of words and one or more placeholders in a particular order, each placeholder denoting a place where a word or phrase other than the words of the dynamic phrase key is to be inserted; and,
the plurality of keys, including the identifiers of the keys are stored on the storage device.

3. The system of claim 2, wherein at least one of the static word or phrase keys identifies one or more of the words of the static word or phrase key by identifiers for corresponding other static words or phrase keys.

4. The system of claim 2, wherein at least one of the dynamic phrase keys identifies one or more of the words of the dynamic phrase key by identifiers for corresponding static words or phrase keys.

5. The system of claim 2, wherein the second textual data is the first textual data to be compressed using the constructed dictionary.

6. The system of claim 2, wherein the second textual data is a different set of textual data than the first textual data to be compressed using the constructed dictionary.

7. The system of claim 2, wherein the plurality of keys including the identifiers of the keys are compressed prior to storing the keys.

8. The system of claim 2, wherein generating the plurality of keys of the dictionary from the second textual data comprises scanning the second textual data and while scanning being configured to identify words and phrases within the second textual data and repetitions of the words and phrases within the second textual data; and generate the plurality of keys from the words and phrases and the repetitions that have been identified.

9. The system of claim 2, wherein the words and the phrase are indivisible into shorter words and phrases that are repetitive within the second textual data, thereby making the words atomic.

10. A system of claim 1, wherein the compression mechanism to compress the uncompressed second textual data to yield the compressed third textual data using the dictionary comprises:

receiving the dictionary, the dictionary having a plurality of keys, each key associated with an identifier, the keys comprising:

a plurality of static word or phrase keys, each static word or phrase key listing one or more unchanging words in a particular order; and, a plurality of dynamic phrase keys, each dynamic phrase key listing a plurality of words and one or more placeholders in a particular order, each placeholder denoting a place where a word or phrase other than the words of the dynamic phrase key is to be inserted;

wherein words and phrases within the textual data with the keys of the dictionary are matched and the words and phrases within the textual data that match the keys of the dictionary with the identifiers of the keys are replaced, and the textual data within which the words and phrases that match the keys have been replaced with the identifiers of the keys are stored on the storage device.

11. The system of claim 10, wherein for each phrase within the textual data that matches a dynamic phrase key, replacing the phrase within the textual data with the identifier of the dynamic phrase key comprises listing a particular word or phrase to be inserted for each placeholder within the dynamic phrase key.

12. The system of claim 10, wherein at least one of the static word or phrase keys identifies one or more of the words of the static word or phrase key by identifiers for corresponding other static words or phrase keys.

13. The system of claim 10, wherein at least one of the dynamic phrase keys identifies one or more of the words of the dynamic phrase key by identifiers for corresponding static words or phrase keys.

14. The system of claim 10, wherein the dictionary based on the textual data that is to be compressed using the dictionary is constructed.

15. The system of claim 10, the dictionary based on textual data other than the textual data that is to be compressed using the dictionary is constructed.

16. A system of claim 1, wherein the decompression mechanism to decompress third textual data to yield the uncompressed second textual data using the dictionary comprises:

receiving the dictionary, the dictionary having a plurality of keys, each key associated with an identifier, the textual data listing one or more of the identifiers, the keys comprising:

a plurality of static word or phrase keys, each static word or phrase key listing one or more unchanging words in a particular order; and, a plurality of dynamic phrase keys, each dynamic phrase key listing a plurality of words and one or more placeholders in a particular order, each placeholder denoting a place where a word or phrase other than the words of the dynamic phrase key is to be inserted;

each identifier listed within the textual data being replaced with the key associated with the identifier within the dictionary, in an iterative manner, until there are no identifiers listed within the textual data; and, the textual data within which the identifiers have been replaced with keys associated with the identifiers within the dictionary being output.

17. The system of claim 16 wherein for each identifier within the textual data that is associated with a dynamic phrase key of the dictionary, replacing the identifier within the textual data with the key associated with the identifier within the dictionary comprises inserting a particular word or phrase for each placeholder within the dynamic phrase key.

18. The system of claim 16, wherein at least one of the static word or phrase keys identifies one or more of the words of the static word or phrase key by identifiers for corresponding other static words or phrase keys.

19. The system of claim 16, wherein at least one of the dynamic phrase keys identifies one or more of the words of the dynamic phrase key by identifiers for corresponding static words or phrase keys.

* * * * *